(12) United States Patent
Chong, Jr. et al.

(10) Patent No.: US 7,370,167 B2
(45) Date of Patent: May 6, 2008

(54) TIME SLICING DEVICE FOR SHARED RESOURCES AND METHOD FOR OPERATING THE SAME

(75) Inventors: Fay Chong, Jr., Cupertino, CA (US); Walter Nixon, Fremont, CA (US); Whay Sing Lee, Newark, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 576 days.

(21) Appl. No.: 10/623,083

(22) Filed: Jul. 17, 2003

(65) Prior Publication Data

US 2005/0015556 A1 Jan. 20, 2005

(51) Int. Cl.
*G06F 12/00* (2006.01)

(52) U.S. Cl. ................. 711/167; 711/154
(58) Field of Classification Search ............. 711/147, 711/148, 154, 167, 105, 5; 365/233, 365, 365/362
See application file for complete search history.

(56) References Cited

U.S. PATENT DOCUMENTS

| | | | | |
|---|---|---|---|---|
| 4,396,915 A | * | 8/1983 | Farnsworth et al. | ... 340/870.03 |
| 4,627,021 A | * | 12/1986 | Persoon et al. | ............ 712/36 |
| 5,005,120 A | * | 4/1991 | Ruetz | ................. 713/100 |
| 5,068,822 A | * | 11/1991 | Lawrence | .............. 712/300 |
| 5,243,703 A | * | 9/1993 | Farmwald et al. | ......... 713/400 |
| 5,404,464 A | * | 4/1995 | Bennett | ................. 710/306 |
| 6,198,686 B1 | * | 3/2001 | Takita et al. | ........... 365/230.06 |
| 7,137,118 B2 | * | 11/2006 | Jahnke | .................... 718/102 |

OTHER PUBLICATIONS

Yasunobu Nakase, et al., Source-Synchronization and Timing Vernier Techniques for 1.2-GB/s SLDRAM Interface, IEEE Journal of Solid-State Circuits, vol. 34, No. 4, pp. 494-501, Apr. 1999.*
Song et al., "NRZ Timing Recovery Technique for Band-Limited Channels," IEEE Journal of Solid-State Circuites, vol. 32, No. 4, pp. 514-520, Apr. 1997.*

* cited by examiner

*Primary Examiner*—Pierre-Michel Bataille
(74) *Attorney, Agent, or Firm*—Martine Penilla & Gencarella, LLP

(57) ABSTRACT

Broadly speaking, a device for addressing a shared resource is disclosed. The device includes at least one register in communication with the shared resource. The at least one register is configured to hold an address that is to be provided to the shared resource upon receipt of a clock signal. The device also includes a multiplexer for providing a next address to the at least one register. The multiplexer is disposed outside of a critical timing path for addressing the shared resource. The device for addressing the shared resource allows multiple users to be connected to the shared resource without adversely affecting both a speed of the shared resource and a number of users that can be achieved in an actual implementation of the shared resource.

21 Claims, 3 Drawing Sheets

TIME SLICING DEVICE FOR SHARED RESOURCES AND METHOD FOR OPERATING THE SAME

CROSS REFERENCE TO RELATED APPLICATIONS

This application is related to U.S. patent application Ser. No. 10/623,026, filed on even date herewith, and entitled "Efficient Utilization of Shared Buffer Memory and Method for Operating the Same." The disclosure of this related application is incorporated herein by reference.

BACKGROUND OF THE INVENTION

1. Field of the Invention

The present invention relates generally to a multi-user memory for digital data.

2. Description of the Related Art

Multi-user memories are being increasingly used to buffer network traffic in router and switching applications. Other applications involving digital data also benefit from the use of multi-user memories. As the number of users of a multi-user memory increases, however, a port address multiplexing logic necessary to connect the increased number of users to the multi-user memory becomes more complex. This increase in complexity acts as a limiting factor for both the speed of the multi-user memory and the number of users that can be achieved in an actual implementation of the multi-user memory.

A conventional multi-user memory receives an address signal directly from an address multiplexer. The address multiplexer receives a number of address inputs representing different address signals to be supplied to the multi-user memory. The address multiplexer also receives a selector signal input to indicate which of the number of address inputs will be passed through an output of the address multiplexer to the multi-user memory. For a number of users to share the multi-user memory, the number of inputs received by the address multiplexer must be equal to the number of users. Thus, with more than just a few users sharing the multi-user memory, the address multiplexer can become large and complex.

There are disadvantages associated with having a large and complex address multiplexer. For example, the large and complex address multiplexer requires more hardware and data path signal routing space when implemented in a CMOS process. Also, the large and complex address multiplexer operates slowly. Such slow operation can necessitate a limiting of a clock rate of a system containing the address multiplexer and multi-user memory. Consequently, limiting of the clock rate adversely affects overall performance of the system.

In view of the foregoing, there is a need for a device, and associated method of operation, that allows multiple users to be efficiently connected to a multi-user memory.

SUMMARY OF THE INVENTION

Broadly speaking, the present invention fills these needs by providing a time slicing device for a shared resource, and associated method of operation, that allows multiple users to be connected to the shared resource without adversely affecting both a speed of the shared resource and a number of users that can be achieved in an actual implementation of the shared resource. More specifically, the present invention incorporates a register chain in direct communication with a multi-user memory. A number of memory addresses can be loaded in a time multiplexed manner into the register chain to be ultimately communicated from the register chain to the multi-user memory. A critical timing path for communicating each of the number of memory addresses from the register chain to the multi-user memory includes propagation of a clock signal from a clock to one of a number of registers in the register chain and propagation of the memory address from the respective register to the multi-user memory. Thus, the potentially complex logic necessary for time multiplexing the number of memory addresses to be loaded into the register chain is located outside of the critical timing path. Furthermore, the time slicing device and associated method of operation of the present invention does not incorporate complex port address multiplexing logic within the critical timing path that would adversely affect performance limits of the multi-user memory.

In one embodiment, a device for addressing a shared resource is disclosed. The device includes at least one register in communication with the shared resource. The at least one register is configured to hold an address that is to be provided to the shared resource upon receipt of a clock signal. The device also includes a multiplexer for providing a next address to the at least one register. The multiplexer is disposed outside of a critical timing path for addressing the shared resource.

In another embodiment, a shared memory is disclosed. The shared memory includes a data port for sending and receiving data. An address port is also included for receiving an address to be used to locate data within the shared memory. The shared memory further includes at least one register in communication with the address port. The at least one register is configured to provide the address to the address port upon receipt of a clock signal. A multiplexer is also included for providing a next address to the at least one register. The multiplexer is disposed outside of a critical timing path for addressing the shared memory.

In another embodiment, a method for addressing a shared resource is disclosed. The method includes an operation for loading at least one register with an address to be provided to the shared resource. The method also includes an operation for providing the address to the shared resource from the at least one register upon receipt of a clock signal.

Other aspects of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION

Broadly speaking, an invention is disclosed for a time slicing device for a shared resource, and associated method of operation, that allows multiple users to be connected to the shared resource without adversely affecting both a speed of the shared resource and a number of users that can be achieved in an actual implementation of the shared resource.

More specifically, the present invention incorporates a register chain in direct communication with a multi-user memory. A number of memory addresses can be loaded in a time multiplexed manner into the register chain to be ultimately communicated from the register chain to the multi-user memory. A critical timing path for communicating each of the number of memory addresses from the register chain to the multi-user memory includes propagation of a clock signal from a clock to one of a number of registers in the register chain and propagation of the memory address from the respective register to the multi-user memory. Thus, the potentially complex logic necessary for time multiplexing the number of memory addresses to be loaded into the register chain is located outside of the critical timing path. Furthermore, the time slicing device and associated method of operation of the present invention does not incorporate complex port address multiplexing logic within the critical timing path that would adversely affect performance limits of the multi-user memory.

It should be appreciated that the present invention can be implemented in numerous ways, including as a process, an apparatus, a system, a device, or a method. Several exemplary embodiments of the invention will now be described in detail with reference to the accompanying drawings.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
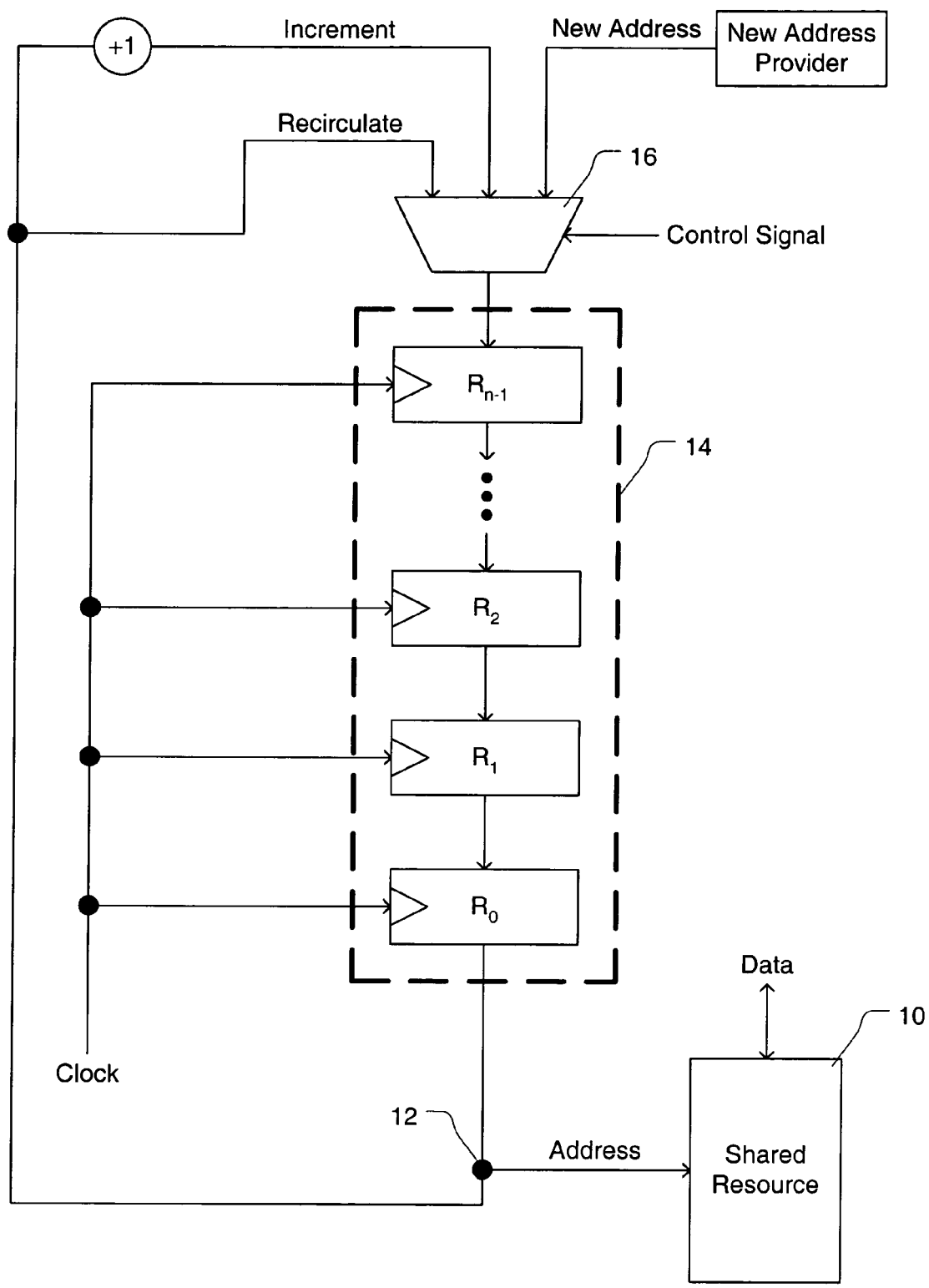
FIG. 1 is an illustration showing a time slicing device for a shared resource, in accordance with one embodiment of the present invention.

FIG. 1 is an illustration showing a time slicing device for a shared resource 10, in accordance with one embodiment of the present invention. The time slicing device includes a number of registers ($R_0$ through $R_{n-1}$) connected to form a register chain 14. Each of the number of registers ($R_0$ through $R_{n-1}$) has a data input, a clock input, and a data output. In one embodiment, each of the registers ($R_0$ through $R_{n-1}$) is an edge triggered cell such as a flip-flop. The register chain 14 is formed by connecting the data output of one of the number of registers ($R_1$ through $R_{n-1}$) to the data input of a subsequent one of the number of registers ($R_0$ through $R_{n-2}$). In this manner, the contents of each register will be shifted to a subsequent register upon receipt of a clock signal at the clock input.

Register $R_{n-1}$ is considered a first register in the register chain 14, and register $R_0$ is considered a last register in the register chain 14. The number of registers ($R_0$ through $R_{n-1}$) in the register chain 14 is arbitrary. In one embodiment, the number of register ($R_0$ through $R_{n-1}$) in the register chain 14 is equal to a number of users that will be connected to the shared resource 10.

The time slicing device further includes a multiplexer 16 having an output in communication with the data input of the first register $R_{n-1}$. At each clock cycle, the multiplexer will communicate an address value to the first register $R_{n-1}$. The multiplexer 16 receives a recirculate input, an increment input, a new address input, and a control signal input. The control signal input is used to select which of the recirculate input, the increment input, and the new address input is to be communicated to the first register $R_{n-1}$ through the multiplexer 16 output.

At each clock cycle, the recirculate input is provided to the multiplexer 16 from the last register $R_0$. Hence, the recirculate input corresponds to an address value contained within the last register $R_0$ prior to the clock signal.

The increment input is also provided to the multiplexer 16 from the last register $R_0$ at each clock cycle. However, the increment input corresponds to the address value contained within the last register $R_0$ prior to the clock signal plus one address value. For example, in the case where the shared resource is a multi-user memory and the data contained within the number of registers are memory addresses, the increment input will correspond to a memory address that is one memory address higher that a previous memory address contained within last register $R_0$ prior to the clock signal.

The new address input provided to the multiplexer 16 corresponds to a new address value to be loaded into the register chain 14. The new address input is provided by a new address provider such as a multiple input multiplexer, a memory manager module, or a buffer allocator module, among others. Circuitry associated with the new address provider is located and operated outside of the time slicing device. To load new addresses into the register chain 14, the new addresses can be time multiplexed and loaded from the new address provider via the new address input. For example, to load register $R_0$ in the embodiment of FIG. 1, the desired new address for register $R_0$ should be available on the new address input of multiplexer 16 at clock cycle 0. Continuing with the example, to load register $R_1$, the desired new address for register $R_1$ should be available on the new address input of multiplexer 16 at clock cycle 1. By clock cycle n−1, both $R_0$ and $R_1$ will be loaded with the desired new address values.

The shared resource 10 is connected to the time slicing device at a node 12. In the case where the shared resource 10 is a multi-user memory, the connection between the node 12 and the shared resource 10 is used to communicate a memory address from the time slicing device to the shared resource 10. Also in this case, the memory address received from the node 12 is used by the shared resource to indicate a location for data retrieval or deposition. In the embodiment of FIG. 1, the node 12 is disposed in connection with the data output of register $R_0$. In this manner, the address value contained within register $R_0$ will be transmitted through node 12 to the shared resource 10 at each clock cycle. In other embodiments, the node 12 can be disposed in connection with the data output of another register (i.e., $R_1$ through $R_{n-1}$). In the present embodiment, only one of the registers $R_0$ through $R_{n-1}$ communicates with the shared resource 10 at a given clock cycle. In one embodiment, performance can be optimized by connecting the shared resource 10 to the register chain 14 at a minimally loaded register output. For example, since the output of register $R_0$ is loaded by the recirculate and increment inputs of the multiplexer 16, performance of the shared resource 10 may be further optimized by moving node 12 to connect with the output of register $R_1$ instead of register $R_0$.

Figure 2:
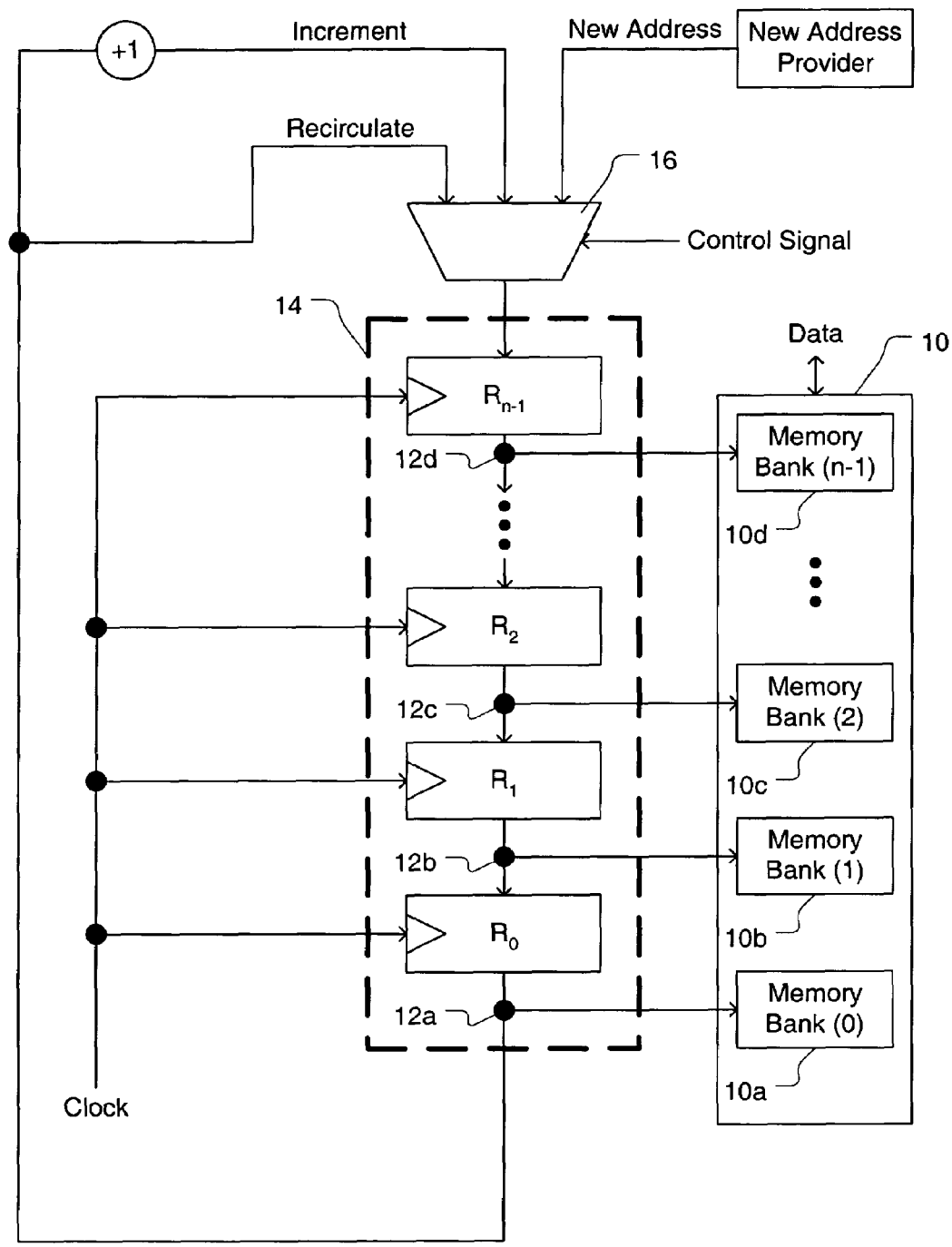
FIG. 2 is an illustration showing the time slicing device connected to a multi-user memory, in accordance with one embodiment of the present invention.

FIG. 2 is an illustration showing the time slicing device connected to a multi-user memory 10, in accordance with one embodiment of the present invention. The multi-user memory 10 includes a number of different memory banks 10a-10d. The registers ($R_0$ through $R_{n-1}$) are equal in number to the different memory banks 10a-10d. Each of the number of different memory banks 10a-10d is connected to the time slicing device at one of nodes 12a-12d, respectively. The connections between the nodes 12a-12d and the multi-user memory 10 are used to communicate a number of memory address from the registers $R_0$ through $R_{n-1}$ through the nodes 12a-12d to each of the number of different memory banks 10a-10d, respectively, at each clock cycle. The number of memory address received from the registers $R_0$ through $R_{n-1}$ are used by each the memory banks 10a-

10d to indicate a location for data retrieval or deposition in the respective memory bank. In the present embodiment, only one of the registers $R_0$ through $R_{n-1}$ communicates with a particular memory bank at a given clock cycle. However, as previously discussed, each memory bank 10a-10d can receive an address from a different one of the registers $R_0$ through $R_{n-1}$ at a given clock cycle.

The critical timing path of the time slicing device includes propagation of a clock signal from a clock to one of the number of registers and propagation of a memory address from the respective register to a memory bank. Due to a direct register-to-memory connection, the time slicing device of the present invention has a high $F_{max}$. Additionally, the new address provider is outside the critical timing path of the time slicing device. Therefore, any signal propagation delay associated with the new address provider (e.g., from a large multiplexer) will not affect the performance of the time slicing device.

Figure 3:
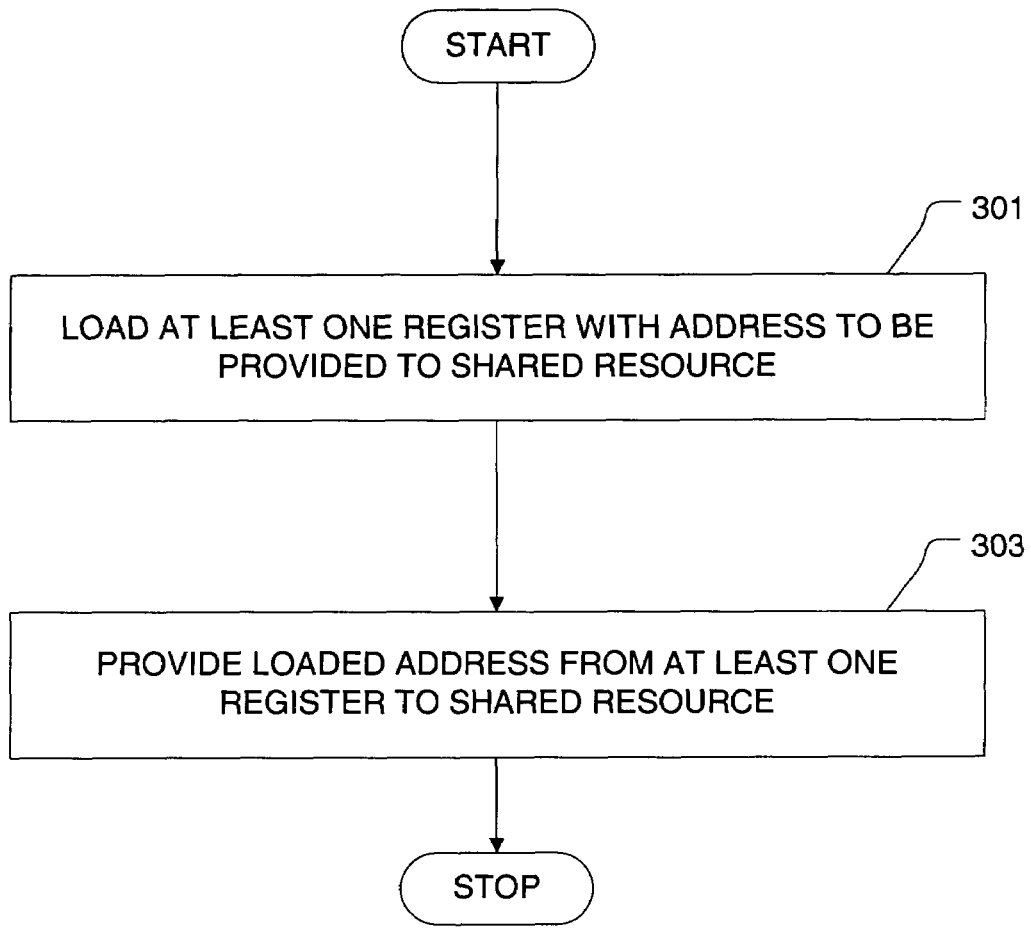
FIG. 3 shows a flowchart illustrating a method for operating a time slicing device for a shared resource, in accordance with one embodiment of the present invention.

FIG. 3 shows a flowchart illustrating a method for operating a time slicing device for a shared resource, in accordance with one embodiment of the present invention. In one embodiment, the shared resource is a shared memory. The method includes an operation 301 in which at least one register is loaded with an address to be provided to a shared resource. In one embodiment, a multiplexer is operated to load the at least one register with either a recirculated address, an incremented address, or a new address. Also in this embodiment, a new address provider is operated to provide a new address input to the multiplexer. In different embodiments, the new address provider can be either a multiple input multiplexer, a memory manager module, or a buffer allocator module, among others. Regardless of the particular embodiment, the new address provider is operated outside of a critical timing path of the time slicing device for providing the address to the shared resource. The critical timing path is defined by propagation of a clock signal to the at least one register from a clock and propagation of the address to the shared resource from the at least one register.

In one embodiment, the at least one register can include a register chain defined by a number of registers. In this embodiment, the register chain can be loaded with a number of addresses to be provided to the shared resource. In an operation 303, a loaded address is directly provided from the at least one register to the shared resource upon receipt of a clock signal.

In the embodiment including the register chain, each of the number of address loaded into the register chain can be provided to different portions of the shared resource upon receipt of the clock signal. Also in the embodiment including the register chain, each of the number of addresses is shifted by moving from one register to a next register upon receipt of the clock signal. This shifting through the register chain allows each of the number of address to be provided to appropriate portions of the shared resource at a specific clock cycle.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A device for addressing a shared resource, comprising:
   at least one register in communication with the shared resource, the at least one register configured to hold an address to be provided to the shared resource upon receipt of a clock signal; and
   a multiplexer for providing a next address to the at least one register, the multiplexer being disposed outside of a critical timing path for addressing the shared resource.

2. A device for addressing a shared resource as recited in claim 1, wherein the multiplexer is configured to receive a recirculate input, an increment input, a new address input, and a control signal, the control signal being used to determine which of the recirculate input, the increment input, and the new address input is to be provided as the next address to the at least one register.

3. A device for addressing a shared resource as recited in claim 2, wherein the new address input is provided in a time multiplexed manner to cause the at least one register to provide the address to the shared resource upon receipt of a specific clock signal.

4. A device for addressing a shared resource as recited in claim 2, wherein the new address input is provided by one of a multiple input multiplexer, a memory manager module, and a buffer allocator module, each of the multiple input multiplexer, the memory manager module, and the buffer allocator module existing outside of the critical timing path for addressing the shared resource.

5. A device for addressing a shared resource as recited in claim 1, wherein the at least one register includes a register chain, the register chain being defined by a number of registers connected in a serial manner, the number of registers including a first register and a last register, the first register being provided with the next address from the multiplexer.

6. A device for addressing a shared resource as recited in claim 5, wherein each of the number of registers has an input and an output, the output of each register that is not the last register in the register chain being connected to the input of a sequential register in the register chain to define the serial manner of connection, the output of the last register in the register chain being connected to an input of the multiplexer.

7. A device for addressing a shared resource as recited in claim 5, wherein each of a number of portions of the shared resource is provided with one of a number of addresses from the output of the number of registers in the register chain upon receipt of the clock signal.

8. A shared memory, comprising:
   a data port for sending and receiving data;
   an address port for receiving an address to be used to locate data within the shared memory;
   at least one register in communication with the address port, the at least one register configured to provide the address to the address port upon receipt of a clock signal; and
   a multiplexer for providing a next address to the at least one register, the multiplexer being disposed outside of a critical timing path for addressing the shared memory.

9. A shared memory as recited in claim 8, wherein the multiplexer is configured to receive a recirculate input, an increment input, a new address input, and a control signal, the control signal being used to determine which of the recirculate input, the increment input, and the new address input is to be provided as the next address to the at least one register.

10. A shared memory as recited in claim 9, wherein the new address input is provided in a time multiplexed manner to cause the at least one register to provide the address to the address port upon receipt of a specific clock signal.

11. A shared memory as recited in claim 9, wherein the new address input is provided by one of a multiple input multiplexer, a memory manager module, and a buffer allocator module, each of the multiple input multiplexer, the memory manager module, and the buffer allocator module existing outside of the critical timing path for addressing the shared memory.

12. A shared memory as recited in claim 8, wherein the at least one register includes a register chain, the register chain being defined by a number of registers connected in a serial manner, the number of registers including a first register and a last register, the first register being provided with the next address from the multiplexer.

13. A shared memory as recited in claim 12, wherein each of the number of registers has an input and an output, the output of each register that is not the last register in the register chain being connected to the input of a sequential register in the register chain to define the serial manner of connection, the output of the last register in the register chain being connected to an input of the multiplexer.

14. A shared memory as recited in claim 12, wherein each of a number of portions of the shared memory is provided with one of a number of addresses from the output of the number of registers in the register chain upon receipt of the clock signal.

15. A method for addressing a shared resource, comprising:
    loading at least one register with an address to be provided to the shared resource; and
    providing the address to the shared resource from the at least one register upon receipt of a clock signal,
    wherein a critical timing path for providing the address to the shared resource is defined by propagation of the clock signal to the at least one register and propagation of the address to the shared resource.

16. A method for addressing a shared resource as recited in claim 15, further comprising:
    operating a multiplexer to load the at least one register with one of a recirculated address, an incremented address, and a new address.

17. A method for addressing a shared resource as recited in claim 16, further comprising:
    operating one of a multiple input multiplexer, a memory manager module, and a buffer allocator module to provide the new address to the multiplexer, wherein the multiple input multiplexer, the memory manager module, and the buffer allocator module are operated outside of a critical timing path for providing the address to the shared resource.

18. A method for addressing a shared resource as recited in claim 15, further comprising:
    providing a register chain defined by the at least one register and a number of additional registers;
    loading the number of additional registers with a number of additional addresses to be provided to the shared resource; and
    providing each of the number of additional addresses to different portions of the shared resource from the number of additional registers upon receipt of the clock signal used to provide the address to the shared resource from the at least one register.

19. A method for addressing a shared resource as recited in claim 18, further comprising:
    shifting the address and the number of additional addresses through the register chain to allow each of the address and the number of additional addresses to be provided to appropriate portions of the shared resource at a specific clock cycle.

20. A method for addressing a shared resource as recited in claim 15, wherein the shared resource is a shared memory.

21. A method for addressing a shared resource as recited in claim 15, wherein the address is provided directly to the shared resource from the at least one register upon receipt of the clock signal.

* * * * *